(12) United States Patent
Hasegawa et al.

(10) Patent No.: US 6,207,585 B1
(45) Date of Patent: Mar. 27, 2001

(54) METHOD OF FORMING STACKED INSULATING FILM AND SEMICONDUCTOR DEVICE USING THE SAME

(75) Inventors: Toshiaki Hasegawa; Junichi Aoyama, both of Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/128,545

(22) Filed: Aug. 4, 1998

(30) Foreign Application Priority Data

Aug. 4, 1997 (JP) .................................................. 9-209258

(51) Int. Cl.[7] .......................... H01L 21/31; H01L 21/469
(52) U.S. Cl. ............................................................. 438/763
(58) Field of Search .................................................. 438/763

(56) References Cited

U.S. PATENT DOCUMENTS

| 4,752,590 | * | 6/1988 | Adams et al. | 438/479 |
| 5,244,698 | * | 9/1993 | Ishihara et al. | 427/563 |
| 5,650,360 | * | 7/1997 | Tomita | 438/624 |
| 5,981,373 | * | 11/1999 | Sunada | 438/624 |

OTHER PUBLICATIONS

M. Matsuura et al., Novel Self–Planarizing CVD Oxide for Interlayer Dielectric Applications, IEEE IEDM, 1994, pp. 117–120.*

* cited by examiner

*Primary Examiner*—Richard Elms
*Assistant Examiner*—Christian D. Wilson
(74) *Attorney, Agent, or Firm*—Sonnenschein, Nath & Rosenthal

(57) ABSTRACT

Disclosed is a method of forming a cap insulating film at a high reliability prior to heat-treatment for removing an —OH group from a planarization insulating film (APL film) which is excellent in a gap fill ability and global planarization ability and which is formed by a liquid phase CVD process. The (lower) cap insulating film is formed by plasma CVD using a source gas containing an inorganic silane compound gas, $O_2$ and a hydrocarbon; or an organic silane compound gas and $O_2$. With this method, the cap insulating film can be formed without occurrence of harmful ammonia and particles in plasma.

7 Claims, 3 Drawing Sheets

METHOD OF FORMING STACKED INSULATING FILM AND SEMICONDUCTOR DEVICE USING THE SAME

BACKGROUND OF THE INVENTION

The present invention relates to a method of forming a stacked insulating film and a semiconductor device using the same, and particularly to a method of forming a stacked insulating film, which method is suitable for forming a planarized interlayer insulating film on a substrate to be processed on which steps due to interconnections are formed, and a semiconductor device using the same.

With the increased degree of integration of semiconductor devices such as LSIs, there has been extensively used a multilayer interconnection structure, as a result of which a width of an interlayer insulating film between adjacent interconnections in the same interconnection layer has become narrow and a thickness of an interlayer insulating film between different interconnection layers has become thin. Such a reduction in a gap between interconnections causes problems such as an interconnection delay due to the raised capacity between the interconnections. Consequently, the real operating speed of a semiconductor device has come to be not based on the scaling rule of 1/K (K: scaling factor), thus failing to sufficiently obtain a merit of the higher degree of integration. To meet various requirements, for example, high speed operation, low power consumption, and low heat generation of a highly integrated semiconductor device, it is essential to prevent the raised capacity between interconnections.

As an insulating material for forming an interlayer insulating film of a semiconductor device, there has been mainly used an inorganic material such as $SiO_2$, SiON or $Si_3N_4$. To reduce a capacity between interconnections in a highly integrated semiconductor device, it is effective to adopt an interlayer insulating film which is made from a material having a low dielectric constant in place of the above-described general inorganic material, as disclosed in Japanese Patent Laid-open No. Sho 63-7650. The material having a low dielectric constant is represented by an inorganic material such as silicon oxide containing fluorine atoms (hereinafter, referred to as "SiOF") or an organic material containing carbon atoms. The present applicant has disclosed, in Japanese Patent Laid-open No. Hei 8-162528, a technique in which a layer made from a material having a low relative dielectric constant of 3.5 or less is as an interlayer insulating film between adjacent interconnections or between interconnection layers at different levels. In the above document, the present applicant has also proposed a semiconductor device in which an interlayer insulating film having a low dielectric constant and a high reliability is formed of a stacked insulating film having a structure that the above layer made from a material having a low dielectric constant is sandwiched between thin insulating films each having a high quality and being made from such as $SiO_2$ (relative dielectric constant: 4), SiON (relative dielectric constant: 4 to 6) or $Si_3N_4$ (relative dielectric constant: 6)

An interlayer insulating film provided between multilayer interconnections, which is not limited to an insulating film having a low dielectric constant, is required to have a gap fill ability and a global planarization ability for burying recesses between adjacent interconnections. The gap fill ability is an ability of filling a space in a fine gap without occurrence of voids, and the global planarization ability is an ability of filling a large space region without occurrence of unevenness in thickness. As one of methods which have been proposed to meet these requirements, there has been known a so-called APL (Advanced Planarization Layer) technology developed by ETE Corporation in England. In this method, CVD is performed using $SiH_4$ and $H_2O_2$ as a source gas in a state in which a substrate to be processed is cooled to about 0° C., whereby $SiO_2$ is deposited, as if it is spread in a dropped liquid state, on the surface of the substrate having irregularities. The film of $SiO_2$ thus obtained has a gap fill ability of sufficiently filling a deep space of an aspect ratio of about 4 and a global planarization ability of sufficiently filling a wide space of 10 μm without occurrence of unevenness in thickness. In this method, however, when the substrate temperature is increased to 10° C. or more, the behavior similar to that of liquid in the course of film formation is lost, with a result that the gap fill ability and the global planariation ability of the film are gradually degraded.

The APL technology is attractive in terms of the shape of the film as described above; however, it is not effective in terms of formation of a film having a low dielectric constant. That is to say, the film obtained by the APL technology exhibits a relative dielectric constant of 4 to 5 which is at the same level as that of a SOG film or $O_3$-TEOS film. This is because a hydroxyl group (—OH group) contained in a planarization insulating film formed by the APL technology (hereinafter, referred to as "APL film") increases the relative dielectric constant, and if a film of stoichiometric $SiO_2$ from which the hydroxyl group is removed is formed, the relative dielectric constant of the film is about 3.8 at most.

A method of adding an organic component in an APL film to reduce the dielectric constant of the film has been reported in the 44th Spring Meeting of Association with Applied Physics Institute (p788 in Proceedings, Lecture No. 30p-F-14, 1997). The introduction of an organic component is realized by use of methylsilane $(CH_3)_xSiH_{4-x}$ (x: natural number of 4 or less) in place of $SiH_4$. The mechanism of reducing the dielectric constant of the APL film is considered to be based on the fact that the polarizability of —$CH_3$ group is small and that the bonding of (—Si—O—Si—) is terminated with —$CH_3$ group to increase the density of the film. The relative dielectric constant of the APL film formed in accordance with this method is about 3.0.

With respect to each APL film, if used as an interlayer insulating film, it is preferably of a stacked structure with a cap insulating film. The cap insulating film, which is formed on the APL film, has a function of removing an —OH group contained in the APL film by the subsequent heat-treatment to reduce the hardening rate at the hardening stage, thereby preventing occurrence of cracks. The cap insulating film is formed by plasma CVD using $SiH_4$ and $N_2O$ as a source gas because it can exhibit a function of preventing occurrence of particles in a vapor phase and also it must be formed at a temperature lower than the heat-treatment temperature. In the above method of forming a cap insulating film, however, ammonia produced from nitrogen and hydrogen generated by dissociation of $SiH_4$ and $N_2O$ in plasma is absorbed on or trapped in the APL film, which exerts adverse effect on characteristics of an element containing the ALP film.

SUMMARY OF THE INVENTION

An object of the present invention is to provide a method of forming a stacked insulating film having an excellent flatness and a high reliability without occurrence of ammonia, particles and cracks by a liquid phase CVD, for example, based on the APL technology, and a highly integrated semiconductor device with a high reliability using the above stacked insulating film as an interlayer insulating film.

To achieve the above object, according to a first aspect of the present invention, there is provided a method of forming a stacked insulating film, including the sequential steps of: forming a planarization insulating film containing an —OH group on a substrate to be processed by a chemical vapor deposition process using a source gas containing either an inorganic silane compound gas or an organic silane compound gas and an oxidizer having an —OH group; forming a cap insulating film on the planarization insulating film using a source gas containing an inorganic silane compound gas, an oxidizer, and a hydrocarbon; and removing the —OH group contained in the planarization insulating film by heat-treatment.

The hydrocarbon is preferably at least one kind selected from methane, ethane, ethylene, acetylene, propane and propylene.

According to a second aspect of the present invention, there is provided a method of forming a stacked insulating film, including the sequential steps of: forming a planarization insulating film containing an —OH group on a substrate to be processed by a chemical vapor deposition process using a source gas containing either an inorganic silane compound gas or an organic silane compound gas and an oxidizer having an —OH group; forming a cap insulating film on the planarization insulating film using a source gas containing an organic silane compound gas and an oxidizer; and removing the —OH group contained in the planarization insulating film by heat-treatment.

The organic silane compound gas is preferably at least one kind selected from methylsilane gas, dimethylsilane gas, trimethylsilane gas and tetramethylsilane gas.

In each of the above methods of the present invention, the oxidizer containing an —OH group is at least one kind selected from a $H_2O_2$ gas (hydrogen peroxide gas not in a plasma state), a plasma of a $H_2O$ gas (that is, water vapor), and a plasma of a mixed gas of $H_2$ and $O_2$.

In each of the above methods of the present invention, a source compound gas for forming a planarization insulating film containing water content may further contain a fluorocarbon based compound represented by tetrafluoroethylene or, of polymers of two or more of monomers of tetrafluoroethylene, a polytetrafluoroethylene having a polymerization whose degree is low enough to allow vaporization.

In each of the above methods of the present invention, at the time of forming a planarization insulating film containing water content, CVD is performed in a condition in which the temperature of the substrate to be processed is controlled at room temperature or less, preferably, 10° C. or less, more preferably, 0° C. or less. It is to be noted that the wording "room temperature" in the specification means the room temperature in a clean room used for usual fabrication of a semiconductor device.

The function of the present invention will be described below.

In the APL technology, a silane based compound reacts with an oxidizer such as $H_2O_2$ to form a silanol intermediate product such as $Si(OH)_xH_{4-x}$ (X: natural number of 4 or less), for example, $Si(OH)_2H_2$ as shown in the following equation, and the intermediate product is dehydrated/condensated, to form a silicon oxide film having a flat surface.

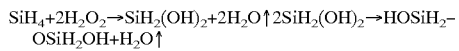

By repeating the polymerization reaction shown in the above equation, an insulating film made from a siloxane polymer is formed. The polymerization reaction is relatively slow with elimination of $H_2O$ (by-product) taken as a rate-limiting factor. In a period of time in which the polymerization does not proceed so much, the film of a polymer of a low degree of polymerization behaves like liquid. As a result, the film obtained by this CVD (liquid phase CVD) satisfies both the gap fill ability and the global planarization ability.

In this liquid phase CVD, if the source gas contains a fluorocarbon gas such as $C_2F_2$, a fluorocarbon-siloxane copolymer is formed under the mechanism shown by the following equation:

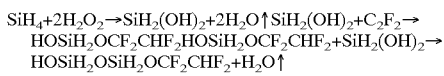

By repeating the copolymerization reaction shown in the above equation, an insulating film having a low dielectric constant and being made from a fluorocarbon-siloxane copolymer is formed. The copolymerization reaction is also relatively slow with elimination of $H_2O$ (by-product) taken as a rate-limiting factor. In a period of time in which the copolymerization does not proceed so much, the film of a copolymer of a low degree of copolymerization behaves like liquid. As a result, the film obtained by this CVD also satisfies both the gap fill ability and the global planarization ability.

In each of the above methods of forming a planarization insulating film, a heat-treatment step for removing the OH group and water content contained in the film is required to be put after film formation. In this heat-treatment step, if the OH group and water content are rapidly removed, the planarization insulating film is cracked, and consequently, the OH group and water content must be slowly removed. To control the removing rate at the step of removing the OH group and the water content and hence to prevent occurrence of cracks, a cap insulating film made from $SiO_2$ or the like is generally formed on the planarization insulating film before heat-treatment. As described above, the cap insulating film is formed by plasma CVD using $SiH_4$ and $N_2O$ as a source gas. In this method, however, ammonia generated in plasma may be absorbed on or trapped in the APL film, which exerts adverse effect on characteristics of an element containing the APL film.

To cope with such a problem, it is desired to develop a method of forming a cap insulating film without occurrence of ammonia in principle. For example, there has been known a CVD process using $SiH_4$ and $O_2$ as a source gas; however, in this method, a large amount of particles of $SiO_2$ occur in a vapor phase, and therefore, such a method is little adopted at present.

In the method of forming a stacked insulating film according to the first aspect of the present invention, a cap insulating film is formed by plasma CVD using a source gas containing an inorganic silane based gas, an oxidizer such as $O_2$, and a hydrocarbon such as ethylene for suppressing occurrence of the above particles. The hydrocarbon has a function of absorbing active radicals and converting them into an inactive component, to reduce the reaction rate of CVD, thereby suppressing occurrence of particles in the vapor phase.

In the method of forming a stacked insulating film according to the second aspect of the present invention, a cap insulating film is formed by plasma CVD using a source gas containing an organic silane based gas and an oxidizer such as $O_2$ for suppressing occurrence of the above particles. Since an organic silane based gas is smaller in reactivity than an inorganic silane based gas, it also reduces the reaction rate of CVD, to thereby suppress occurrence of particles in the vapor phase.

In this way, by adoption of the method of forming a stacked insulating film of the present invention, there can be provided a highly integrated semiconductor device having less defect due to particles and less effect due to ammonia.

Further, by adoption of the method of forming a stacked insulating film of the present invention, an interlayer insulating film having a planarized surface can be formed at a high reliability on a substrate to be processed on which steps due to interconnections are formed.

DETAILED DESCRIPTION OF THE PREFERRED EMBODIMENTS

Hereinafter, embodiments of a method of forming a stacked insulating film and a semiconductor device using the same according to the present invention will be described with reference to the accompanying drawings.

First, one configuration example of a liquid phase CVD system used for formation of an APL film in the method of forming a stacked insulating film according to the present invention will be described with reference to a schematic sectional view shown in FIG. 3. This CVD system has the same basic configuration as that of a single wafer type low pressure CVD system, in which a substrate stage 2 for mounting a substrate 1 to be processed and a gas diffusion plate 3 are oppositely disposed in a CVD chamber 5. The substrate stage 2, through which a refrigerant such as Fluorinert (trade name, produced by Minnesota Mining AND Manufacturing Co.) or ethanol supplied from a cooling means (not shown) is circulated, can control the temperature of the substrate 1 at a low value, for example, 0° C. The substrate stage 2 may contain a heater (not shown). Gas pipe lines 4 through which an inorganic silane compound, an organic silane compound, and an oxidizer are introduced to the gas diffusion plate 3 are connected to the gas diffusion plate 3, whereby a mixed gas of these compounds can be uniformly supplied to the substrate 1. Each of these gas pipe lines 4 and the gas diffusion plate 3 is added with a heating means, for example, a heater for heating it as needed for preventing a raw compound from being condensated or solidified. A remote plasma generator (not shown) may be provided in the course of the oxidizer pipe line. In the case where $H_2O$ or a mixed gas of $H_2$ and $O_2$ is used as the source of the oxidizer, the remote plasma generator can supply an active oxidizer in the form of $H_2O$ plasma or mixed gas ($H_2+O_2$) plasma to the gas diffusion plate 3. The remote plasma generator may be of the known capacitive coupling type, inductive coupling type, or microwave excitation type.

Figure 3:
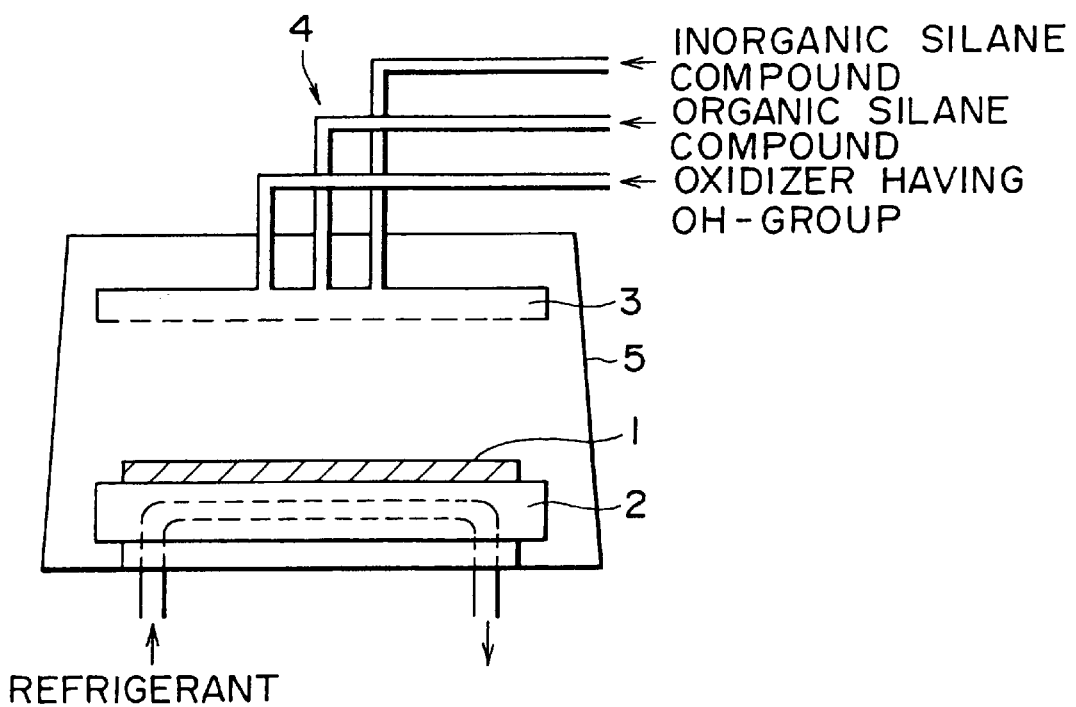
FIG. 3 is a schematic sectional view showing one configuration example of a liquid phase CVD system used for the method of forming a stacked insulating film of the present invention.

In FIG. 3, ports for carrying the substrate 1 in or from the CVD chamber 5, a gas discharge port, a vacuum pump, the details of a temperature controller, and the like are omitted.

Figure 4:
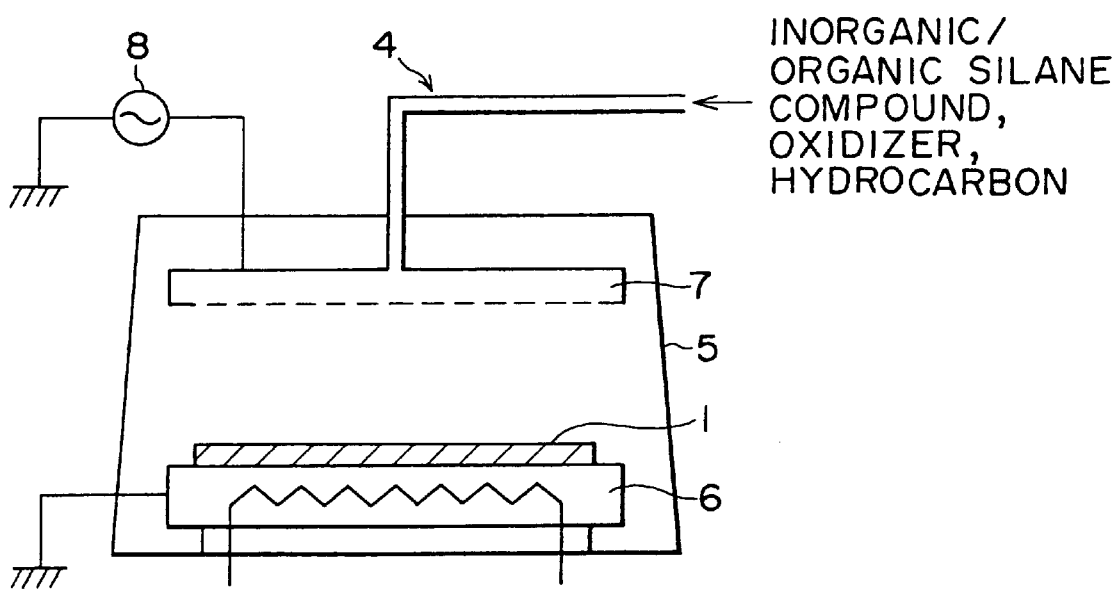
FIG. 4 is a schematic sectional view showing one configuration example of a plasma CVD system used for the method of forming a stacked insulating film of the present invention.

FIG. 4 is a schematic sectional view showing one configuration sample of a CVD system used for formation of a cap insulating film in the method of forming a stacked insulating film according to the present invention. This CVD system has the same basic configuration as that of a single wafer type diode parallel plate plasma CVD system. In FIG. 4, parts corresponding to those of the liquid phase CVD system shown in FIG. 3 are indicated by the same reference numerals.

A substrate mounting electrode 6 for mounting a substrate 1 to be processed and a counter electrode 7 serving as a gas diffusion plate are oppositely disposed in a CVD chamber 5. The substrate mounting electrode 6 has an earth potential, and contains a heating means, for example, a heater for heating the substrate 1 and thereby it can control the temperature of the substrate 1 at a suitable value in a range of about 300 to 400° C. The counter electrode 7, which is connected to a RF power supply 8, is of an anode-couple type. Like the system shown in FIG. 3, gas pipe lines 4 through which an inorganic silane compound, an organic silane compound, an oxidizer, an unsaturated hydrocarbon, and a carrier gas are introduced are connected to the counter electrode 7, whereby a mixed gas of these compounds can be uniformly supplied to the substrate 1.

Even in FIG. 4, ports for carrying the substrate 1 in or from the CVD chamber 5, a gas discharge port, a vacuum pump, the details of a temperature controller, and the like are omitted.

The liquid phase CVD system shown in FIG. 3 may be connected to the plasma CVD system shown in FIG. 4 via a gate valve (not shown), to constitute a continuous CVD system which makes it possible to continuously form a planarization insulating film and a cap insulating film at a high throughput. The continuous CVD system may be further connected to a heat-treatment apparatus via a gate valve (not shown), to constitute a continuously processing system.

Figure 2:
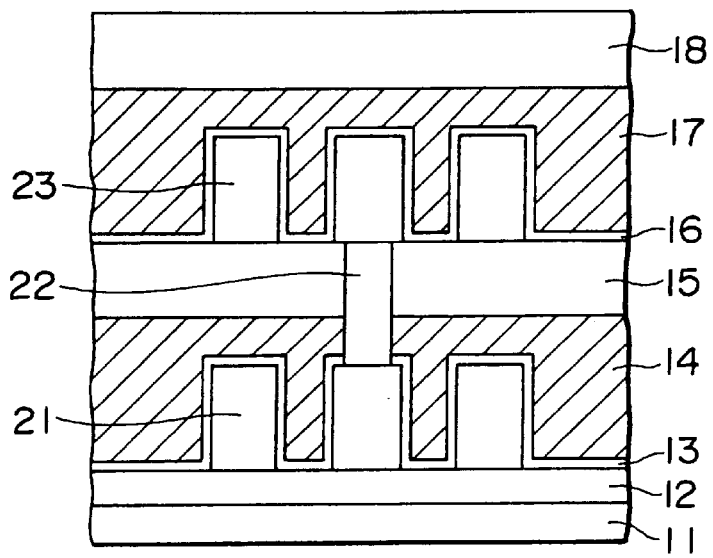
FIG. 2 is a schematic sectional view illustrating an example in which a method of forming a stacked insulating film of the present invention is applied to formation of an interlayer insulating film of a semiconductor device having a multilayer interconnection structure.

FIG. 2 is a schematic sectional view showing an example in which the method of forming a stacked insulating film according to the present invention is applied to formation of an interlayer insulating film of a semiconductor device having a multilayer interconnection structure.

A semiconductor device shown in FIG. 2 has a multilayer interconnection structure in which lower layer interconnections 21 and upper layer interconnections 23 are formed on a lower insulating film 12 on a semiconductor substrate 11 and each via-contact 22 is formed for connecting one of the lower layer interconnections 21 to one of the upper layer interconnections 23. The method of forming a stacked insulating film of the present invention is applied to formation of an interlayer insulating film of such a multilayer interconnection structure. To be more specific, the lower layer interconnections 21 made from an Al based metal, polycrystalline silicon, a polycide of a refractory metal, or the like are formed on the lower insulating film 12. A thin lower protective film 13 having a conformal shape with the lower layer interconnections 21 is formed in such a manner as to cover the lower layer interconnections 21, as needed. Reference numeral 14 indicates a lower planarization insulating film, which is formed in such a manner as to bury steps formed by the lower layer interconnections 21 and to have a flat surface. A lower cap insulating film 15 is further formed on the lower planarization insulating film 14. These lower planarization insulating film 14 and the lower cap insulating film 15 form a stacked insulating film.

The via-contact 22 made from an Al based metal, polycrystalline silicon, tungsten, or the like is buried in a via-hole passing through the lower cap insulating film 15, lower planarization insulating film 14 and lower protective film 13. The via-contact 22 may be formed with a contact metal, a barrier metal, and the like (not shown).

On the lower cap insulating film 15 is formed upper layer interconnections 23 made from an Al based metal, polycrystalline silicon, a polycide of a refractory metal, or the like. A thin upper protective film 16 having a conformal shape with the upper layer interconnections 23 is formed in such a manner as to cover the upper layer interconnections 23, as needed. Reference numeral 17 indicates an upper planarization insulating film, which is formed in such a manner as to bury steps formed by the upper layer interconnections 23 and to have a flat surface. An upper cap insulating film 18 is further formed on the upper planarization insulating film 17. In the case where the upper layer interconnections 23 are the uppermost layer interconnections, the upper cap insulating film 18 may be a final passivation film.

With the multilayer interconnection structure shown in FIG. 2, there can be provided a highly integrated semiconductor device capable of preventing occurrence of cracks upon heat-treatment of a planarization insulating film and enhancing the flatness of an interlayer insulating film composed of a stacked insulating film.

The method of forming a stacked interlayer insulating film and a semiconductor device using the same according to the present invention will be more fully understood by way of, while not exclusively, the following examples with reference to the accompanying drawings.

[EXAMPLE 1]

In this example, a planarization insulating film (organic APL film) having an —OH group is formed by liquid phase CVD using an organic silane compound gas and $H_2O_2$ as a source gas and then a cap insulating film is formed by plasma CVD using $SiH_4$, $O_2$ and $C_2H_4$ (ethylene) as a source gas, to thereby form a stacked insulating film. Further, as a substrate to be processed, there is used a substrate in which steps are formed by metal interconnections made from Al or the like. The process of forming such a stacked insulating film will be described with reference to FIGS. 1A to 1C. In these figures, parts corresponding to those of the semiconductor device previously described with reference to FIG. 2 are indicated by the same reference numerals.

Figure 1A:
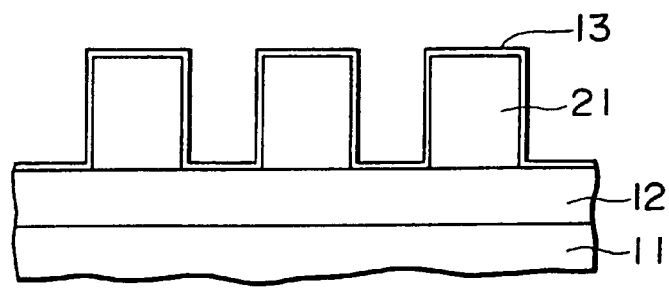
FIGS. 1A to 1C are schematic sectional views illustrating a formation process in each of Examples 1 and 2 of the present invention.

As shown in Fig. 1A, a substrate to be processed in this example is prepared by forming, on a semiconductor substrate 11 made from Si or the like on which a MOS transistor (not shown) and the like are formed, a lower insulating film 12 made from $SiO_2$ or the like, lower layer interconnections 21 made from Al-1% Si or the like, and a lower protective film 13 made from $SiO_2$ or the like which is formed in such a manner as to conformably cover the lower layer interconnections 21.

The lower insulating film 12 is formed to a thickness of 500 nm by plasma CVD using a mixed gas of $SiH_4/N_2O$ or a mixed gas of $TEOS/O_2$. The lower layer interconnections 21 are formed to a thickness of 500 nm in such a manner as to have a line-and-space pattern of 0.25 μm (aspect ratio: 2) by sputtering using a target made from Al-1% Si, resist mask patterning, and dry etching using a chlorine based gas. While not shown in FIG. 1A, a wide recess or gap (from several μm to several tens μm) between adjacent ones of the lower layer interconnections 21 is formed on the substrate to be processed. The lower protective film 13, which is adapted to prevent corrosion of the lower layer interconnections 21 and hence to increase the reliability, has a thickness of about 50 nm.

The lower protective film 13 is formed using the diode parallel plate plasma CVD system shown in FIG. 4 under the following condition:

| | |
|---|---|
| $SiH_4$ | 40 sccm |
| $N_2O$ | 100 sccm |
| He | 50 sccm |
| gas pressure | 100 Pa |
| RF power | 1.0 W/cm² (13.56 MHz) |
| substrate temperature | 350° C. |

Figure 1B:
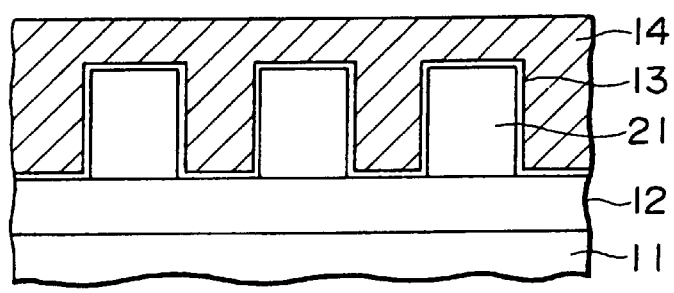

After formation of the lower protective film, the substrate to be processed is carried into the liquid phase CVD system shown in FIG. 3 and is set on the substrate stage 2. Then, a lower planarization insulating film 14 is flatly formed to a thickness, for example, of 800 nm in such a manner as to bury steps or recesses in the following CVD condition. The state of the substrate after film formation is shown in FIG. 1B.

| | |
|---|---|
| $SiH_4$ | 100 sccm |
| $(CH_3)SiH_3$ | 20 sccm |
| $H_2O_2$ | 200 sccm |
| gas pressure | 200 Pa |
| substrate temperature | 0° C. |

In this liquid phase CVD step, since $H_2O_2$ (mp=−0.43° C., bp=152° C.) is a liquid source, it is vaporized before being introduced in the CVD chamber 5. In this case, a carrier gas such as Ar or He may be used for introducing $H_2O_2$ in the CVD chamber 5. The gas diffusion plate 3 is controlled, for example, at 100° C. for preventing condensation of the source gas thereon. In addition, $SiH_4$ may be replaced with disilane ($Si_2H_6$), and further $(CH_3)SiH_3$ may be replaced with $(CH_3)_2SiH_2$, $(CH_3)_3SiH$ or a mixture thereof.

Although the lower planarization insulating film 14 is formed of the organic APL (Advanced PLanarization Layer) film, which is named by the present inventor, in this example, it may be formed of an inorganic APL film, for example, in the following CVD condition:

| | |
|---|---|
| $SiH_4$ | 100 sccm |
| $H_2O_2$ | 200 sccm |
| $N_2$ (carrier gas) | 200 sccm |
| gas pressure | 200 Pa |
| substrate temperature | 0° C. |

In the case of formation either the organic APL film or inorganic APL film as the lower planarization insulating film 14, if a fluorocarbon based compound gas is added in the source gas, there can be obtained a planarization insulating film containing fluorine and having a low dielectric constant.

The substrate on which the lower planarization insulating film 14 has been formed is carried into the plasma CVD system shown in FIG. 4 and is set on the substrate mounting electrode 6. Then, a lower cap insulating film 15 is formed to a thickness of 300 nm on the surface of the flat lower planarization insulating film 14 under the following plasma CVD condition:

| | |
|---|---|
| SiH$_4$ | 100 sccm |
| O$_2$ | 500 sccm |
| C$_2$H$_4$ | 10 sccm |
| N$_2$ (carrier gas) | 1000 sccm |
| gas pressure | 1330 Pa |
| RF power | 1000 W (13.56 MHz) |
| substrate temperature | 350° C. |

In this plasma CVD step, ammonia is not generated in plasma and the reaction slowly proceeds because ethylene (C$_2$H$_4$) captures radicals in plasma to thereby suppress occurrence of particles in the vapor phase. The other hydrocarbon being in a gas state at room temperature or vaporizable, such as ethane, acetylene, propane or propylene may be used in place of ethylene.

Next, the lower planarization insulating film 14 having the OH group, which has been formed by the liquid phase CVD, is heat-treated at 400° C. for 15 min in a nitrogen atmosphere at atmospheric pressure. The heat-treatment may be performed using a general diffusion furnace or may be continuously performed with the substrate held on the substrate mounting electrode 6 in the plasma CVD system shown in FIG. 4.

Figure 1C:
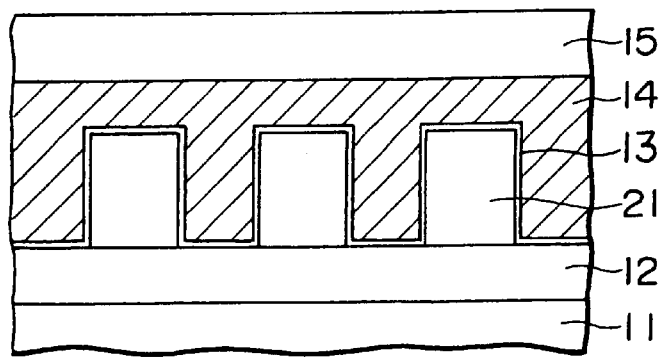

The substrate to be processed after heat-treatment is shown in Fig. 1C. The water content removing rate at the step of removing water content from the lower planarization insulating film 14 is controlled by the presence of the lower cap insulating film 15, to thereby prevent occurrence of cracks.

The subsequent steps of forming via-contact holes in the stacked film composed of the lower cap insulating film 15, lower planarization insulating film 14, and lower protective film 13 by dry etching, filling the via-contact holes with contact plugs, and the like may be carried out in accordance with the usual procedure. Since the etching characteristic of the lower planarization insulating film 14 is substantially equal to that of the general SiO$_2$ film, the above dry etching can be performed in one step, to thereby enhance the throughput of the process.

Thereafter, upper layer interconnections, an upper protective film, an upper planarization insulating film, and an upper cap insulating film are formed by repeating the above procedures of forming the lower layer interconnections, lower protective film, lower planarization insulating film, and lower cap insulating film, to obtain a semiconductor device having a multilayer interconnection structure as shown in FIG. 2.

According to the method described in this example characterized by forming a cap insulating film using a source gas added with ethylene, there can be obtained a stacked insulating film with a high reliability without occurrence of particles, ammonia and cracks, and a semiconductor device using the same.

[EXAMPLE 2]

In this example, a planarization insulating film (organic APL film) having an —OH group is formed by liquid phase CVD using an organic silane compound gas and H$_2$O$_2$ as a source gas and then a cap insulating film is formed by plasma CVD using monomethylsilane and O$_2$ as a source gas, to thereby form a stacked insulating film. As a substrate to be processed in this example, there is used a substrate in which steps are formed by metal interconnections made from Al or the like. The process of forming such a stacked insulating film will be described with reference to FIGS. 1A to 1C. However, the steps until the lower planarization insulating film 14 is formed are the same as those described in Example 1 with reference to FIGS. 1A and 1B, and therefore, the explanation thereof is omitted.

The substrate on which the lower planarization insulating film 14 has been formed is carried into the plasma CVD system shown in FIG. 4 and is set on the substrate mounting electrode 6. Then, a lower cap insulating film 15 is formed to a thickness of 300 nm on the surface of the flat lower planarization insulating film 14 under the following plasma CVD condition:

| | |
|---|---|
| (CH$_3$)SiH$_3$ | 100 sccm |
| O$_2$ | 500 sccm |
| gas pressure | 65 Pa |
| RF power | 1500 W (13.56 MHz) |
| substrate temperature | 350° C. |

In this plasma CVD step, ammonia is not generated in plasma, and since monomethylsilane having a small reactivity is used as a silicon source, it is possible to suppress occurrence of particles in the vapor phase. In addition, monomethylsilane may be replaced with dimethylsilane, trimethylsilane, or a mixture thereof.

The heat-treatment for the lower planarization insulating film 14 having the OH group, which has been formed by the liquid phase CVD, may be performed in the same condition as that in Example 1. The substrate to be processed after heat-treatment is shown in FIG. 1C. The water content removing rate at the step of removing water content from the lower planarization insulating film 14 is controlled by the presence of the lower cap insulating film 15, to thereby prevent occurrence of cracks.

The subsequent steps of forming via-contact holes in the stacked film composed of the lower cap insulating film 15, lower planarization insulating film 14, and lower protective film 13 by dry etching, filling the via-contact holes with contact plugs, and the like may be carried out in accordance with the usual procedure. Since the etching characteristic of the lower planarization insulating film 14 is substantially equal to that of the general SiO$_2$ film, the above dry etching can be performed in one step, to thereby enhance the throughput of the process.

Thereafter, upper layer interconnections, an upper protective film, an upper planarization insulating film, and an upper cap insulating film are formed by repeating the above procedures of forming the lower layer interconnections, lower protective film, lower planarization insulating film, and lower cap insulating film, to obtain a semiconductor device having a multilayer interconnection structure as shown in FIG. 2.

According to the method described in this example characterized by forming a cap insulating film using monomethysilane as a silicon source gas, there can be obtained a stacked insulating film with a high reliability without occurrence of particles, ammonia and cracks, and a semiconductor device using the same.

Although the present invention has been described with reference to the two examples, such description is for illustrative purposes only, and it is to be noted that the present invention is not limited thereto.

For example, as the hydrocarbon added to the source gas for forming the cap insulating film, there may be suitably used a saturated or unsaturated hydrocarbon gas having low molecules which is in a gas state at room temperature or vaporizable or a mixture thereof, in addition to methane, ethane, ethylene, acetylene, propane or propylene.

Similarly, as the organic silane compound as the source gas for forming the cap insulating film, there may be used an ethylsilane based compound or a vaporizable alkylsilane based gas, in addition to the methylsilane based compound.

In addition, the substrate to be processed used in the examples on which steps are formed by an interconnection layer made from the Al-1% Si alloy may be replaced with a substrate to be processed on which steps are formed by an interconnection layer made from polycrystalline silicon, a refractory metal, a stacked structure thereof, or a polycide of a refractory metal. In this case, the temperature condition such as an annealing condition for the insulating film having a low dielectric film can be shifted to the high temperature side.

Although the structure of the semiconductor device in which a stacked insulating film including a planarization insulating film is formed on an interconnection layer is exemplified, the present invention can be applied to a structure of a semiconductor device in which grooves are formed in a stacked insulating film including a planarization insulating film and interconnections are buried in the grooves by etch-back or polishing. The present invention can be also applied to the case using a stacked insulating film as a final passivation film and the case where a trench isolation or the like is flatly buried without occurrence of particles, cracks or ammonia. The semiconductor substrate made from Si used in the examples may be replaced with a compound semiconductor substrate made from GaAs or the like. The present invention can be applied not only to a semiconductor device but also to a thin film head or a thin film inductor, and various RF micro-electronic devices.

What is claimed is:

1. A method of forming a stacked insulating film, comprising the sequential steps of:

forming a planarization insulating film containing an —OH group on a substrate to be processed by a chemical vapor deposition process using a source gas containing either an inorganic silane compound gas or an organic silane compound gas and an oxidizer having an —OH group:

forming a cap insulating film on said planarization insulating film using a source gas containing an inorganic silane compound gas, an oxidizer, and a hydrocarbon; and removing the —OH group contained in said planarization insulating film by heat-treatment, wherein said source gas used at said step of forming said planarization insulating film containing an —OH group further contains a fluorocarbon based compound.

2. A method of forming a stacked insulating film according to claim 1, wherein said hydrocarbon is at least one kind selected from methane, ethane, ethylene, acetylene, propane and propylene.

3. A method of forming a stacked insulating film according to claim 1, wherein said organic silane compound gas is at least one kind selected from methylsilane gas, dimethylsilane gas, trimethylsilane gas and tetramethylsilane gas.

4. A method of forming a stacked insulating film according to claim 1, wherein said oxidizer containing an —OH group is at least one kind selected from a H2O2 gas, a plasma of a $H_2O$ gas, and a plasma of a mixed gas of $H_2$ and $O_2$.

5. A method of forming a stacked insulating film according to claim 1, wherein said substrate to be processed is controlled at room temperature or less at said step of forming said planarization insulating film containing an —OH group.

6. A method of forming a stacked insulating film according to claim 1, wherein said substrate to be processed has steps and said planarization insulating film is formed in such a manner as to bury said steps and to have an approximately flat surface.

7. A method of forming a stacked insulating film, comprising the sequential steps of:

forming a planarization insulating film containing an —OH group on a substrate to be processed by a chemical vapor deposition process using a source gas containing either an inorganic silane compound gas or an organic silane compound gas and an oxidizer having an —OH group:

forming a cap insulating film on said planarization insulating film using a source gas containing an inorganic silane compound gas, an oxidizer, and a hydrocarbon; and removing the —OH group contained in said planarization insulating film by heat-treatment, wherein said source gas used at said step of forming said planarization insulating film containing an —OH group further contains a fluorocarbon based compound.

* * * * *